US006678205B2

(12) United States Patent
Johnson et al.

(10) Patent No.: US 6,678,205 B2
(45) Date of Patent: Jan. 13, 2004

(54) MULTI-MODE SYNCHRONOUS MEMORY DEVICE AND METHOD OF OPERATING AND TESTING SAME

(75) Inventors: Brian Johnson, Boise, ID (US); Brent Keeth, Boise, ID (US); Jeffrey W. Janzen, Meridian, ID (US); Troy A. Manning, Meridian, ID (US); Chris G. Martin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 162 days.

(21) Appl. No.: 10/036,141

(22) Filed: Dec. 26, 2001

(65) Prior Publication Data

US 2003/0117881 A1 Jun. 26, 2003

(51) Int. Cl.$^7$ ................................................. G11C 8/00
(52) U.S. Cl. .................. 365/233; 365/194; 365/230.01; 327/269; 327/141; 327/155
(58) Field of Search ................................ 365/233, 194, 365/230.08, 230.01; 327/269, 141, 155

(56) References Cited

U.S. PATENT DOCUMENTS

| | | | | |
|---|---|---|---|---|
| 5,796,673 A | * | 8/1998 | Foss et al. | 365/233 |
| 6,333,896 B1 | * | 12/2001 | Lee | 365/233 |
| 6,434,083 B2 | * | 8/2002 | Lim | 365/233 |

* cited by examiner

Primary Examiner—Van Thu Nguyen
Assistant Examiner—Nam Nguyen
(74) Attorney, Agent, or Firm—Hugh R. Kress; Browning Bushman P.C.

(57) ABSTRACT

A synchronous semiconductor memory device is operable in a normal mode and an alternative mode. The semiconductor device has a command bus for receiving a plurality of synchronously captured input signals, and a plurality of asynchronous input terminals for receiving a plurality of asynchronous input signals. The device further has a clock input for receiving an external clock signal thereon, with the device being specified by the manufacturer to be operated in the normal mode using an external clock signal having a frequency no less than a predetermined minimum frequency. An internal delay locked loop (DLL) clocking circuit is coupled to the clock input terminal and is responsive in normal operating mode to be responsive to the external clock signal to generate at least one internal clock signal, control circuitry in the device is responsive to a predetermined sequence of asynchronous signals applied to the device's asynchronous input terminals to place the device in an alternative mode of operation in which the internal clocking circuit is disabled, such that the device may be operated in the alternative mode using an external clock signal having a frequency less than the predetermined minimum frequency. The alternative mode of operation facilitates testing of the device at a speed less than the minimum frequency specified for the normal mode of operation.

49 Claims, 4 Drawing Sheets

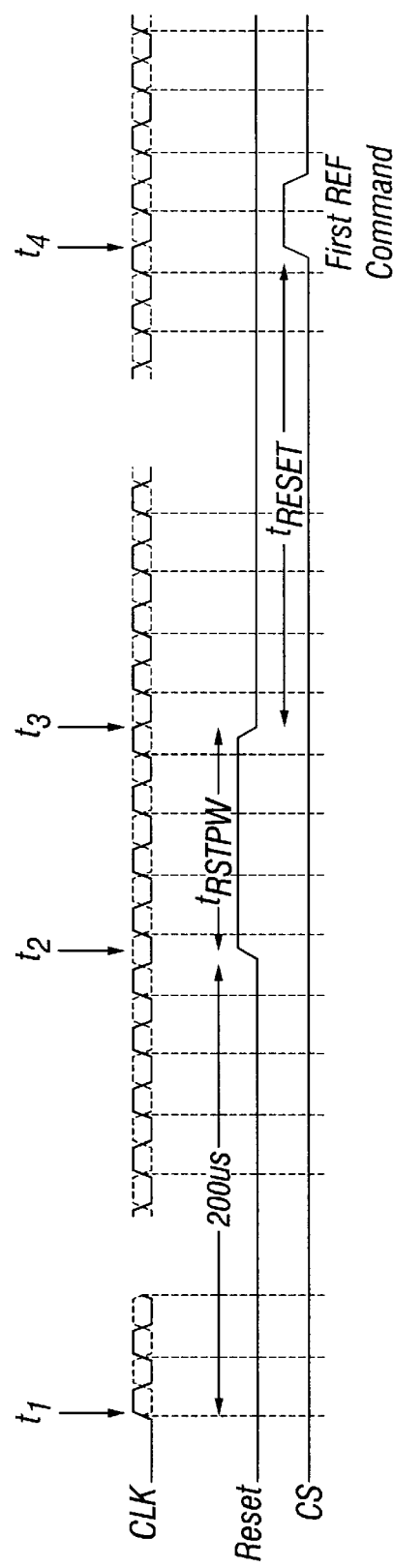
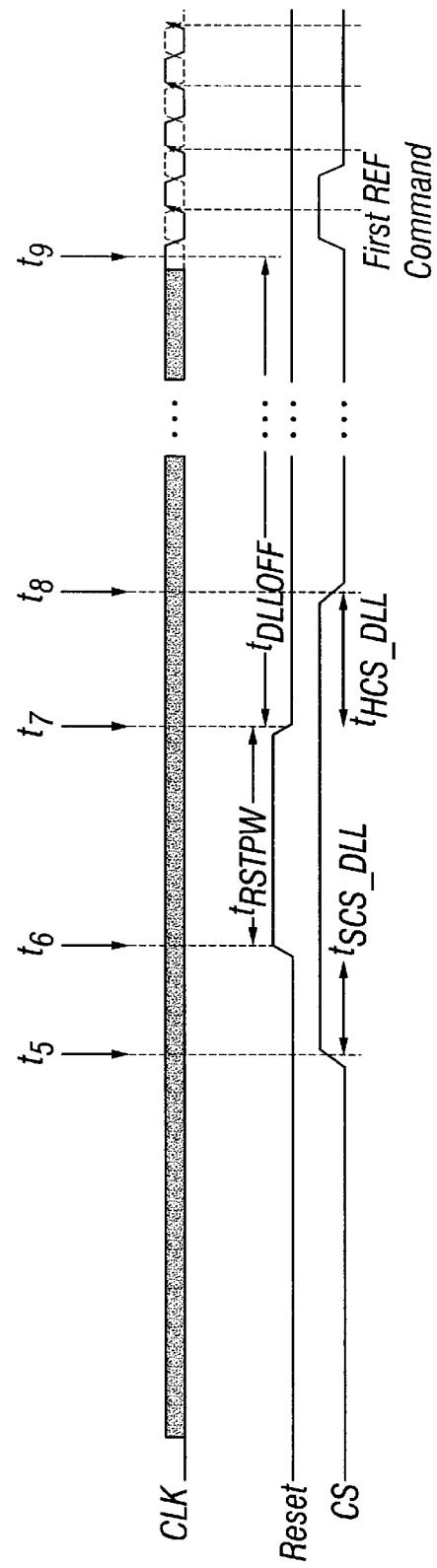
*FIGURE 3A*
*FIGURE 3B*

MULTI-MODE SYNCHRONOUS MEMORY DEVICE AND METHOD OF OPERATING AND TESTING SAME

FIELD OF THE INVENTION

This invention relates generally to semiconductor devices, and more particularly relates to synchronous semiconductor devices, i.e., semiconductor devices whose operation is coordinated by an externally-applied oscillating clock signal.

BACKGROUND OF THE INVENTION

The field of semiconductor devices, including microprocessors, memory devices, digital signal processors, and the like, is enormously active and rapidly developing. Various categories and sub-categories of semiconductor devices are known and commercially available. The ever-increasing popularity and ubiquity of computers and computer-based devices, both in the consumer and industrial realms, is such that the demand for semiconductor devices of a variety of different types will continue to grow for the foreseeable future.

As a general proposition, semiconductor devices can be classified into one of two broad categories: synchronous and asynchronous. A synchronous semiconductor device is one whose operation is coordinated by or synchronized with a (typically) externally-applied clock signal; whereas an asynchronous device requires no clock signal.

One of the more common categories of semiconductor memory devices used today is the dynamic random access memory, or DRAM. Among the desirable characteristics of any DRAM are a high storage capacity per unit area of semiconductor die area, fast access speeds, low power consumption, and low cost.

One approach that has been used to optimize the desirable properties of DRAM has been to design such devices such that they are accessible synchronously. A synchronous DRAM typically requires an externally-applied clocking signal, as well as other externally-applied control signals whose timing must bear certain predetermined relationships with the clock signal. Likewise, digital data is read from and written to a synchronous memory device in a synchronous relationship to the externally-applied clock signal. Synchronous DRAM technologies have been under development for many years, and synchronous DRAM (frequently referred to as "SDRAM") is used in a broad spectrum of commercial and industrial applications, including the personal computer industry.

Those of ordinary skill in the art will appreciate that, as the storage capacity of SDRAMs is increased, so too does the die size of the semiconductor substrate usually increase (notwithstanding concurrent improvements in semiconductor processing technologies allowing for higher-density memory storage per unit area). It is also recognized that as the substrate size increases, other factors affecting the overall synchronization of the electrical signals propagating throughout the substrate also come into play. Issues such as capacitive coupling, impedance loading, processing variation and the like can make it challenging to ensure that the interrelationship between the timing of separate signals conducted along and within the substrate remains synchronized. As the processing speed of a semiconductor device increases, such synchronization issues (sometimes referred to generally as "skew") can become more and more critical. Timing differentials on the order of picoseconds can become determinative of whether a device will operate reliably and properly.

In typical implementations, the external clock signal CLK comprises a simple, periodic "square" wave, such as shown in FIG. 3a, oscillating with reasonably uniform periodicity between a logical high voltage level (for example, 3.3 V) and a logical low level (typically 0 V) with a duty cycle of 50% (meaning that the signal is at a logical "high" level the same amount of time that it is at a logical "low" level during each complete clock cycle). In present state-of-the-art semiconductor devices, the clock signal may have a frequency on the order of hundreds of megahertz.

A synchronous semiconductor device such as an SDRAM will typically require an external input signal such as a clock signal to be provided to several (or even numerous) separate but interrelated functional subcircuits of the device. As a matter of ordinary semiconductor device layout, it is typical for each of the separate subcircuits of an overall device to be physically disposed at different and perhaps distributed locations throughout the substrate as a whole. This means that the conductive lengths, and hence such characteristics as capacitive and complex impedance loads of the various conductive traces which carry electrical signals throughout the substrate, will vary from signal to signal. Hence, for example, the propagation delay of a clock signal from a clock signal input pin to one functional subcircuit may be different than the propagation delay to another functional subcircuit; such differences can be critical for devices operating at very high clock rates, on the order of 100 MHz or so (and perhaps less).

To address such considerations, an approach referred to as "delay-locked loop" or "DLL" can be employed. FIG. 1 is illustrative of a simple example of DLL implementation. In FIG. 1, an externally-applied clock signal CLK is applied to an input pin 12 of a hypothetical memory device 10. As shown in FIG. 1, the externally-applied CLK signal is applied to a DLL block 20. DLL block 20 operates to derive a plurality of separate internal clock signals which are then provided to the various subcircuits of memory device 10 on lines 22, 24, and 26. (Although only three internal clock signals are depicted in FIG. 1, those of ordinary skill will appreciate that more than three internal clock signals may be required in any given implementation.) The function of DLL block 20 (which may represent circuitry distributed throughout the area of the substrate, notwithstanding the centralized location represented for convenience in FIG. 1) is to adjust the relative timing of the clock signals provided on lines 22, 24, and 26 to the various distributed subcircuits of device 10 such that overall synchronous operation of the device 10 can be achieved.

DLL blocks such as DLL block 20 in FIG. 1 may utilize some type of loop-back operation, as represented by exemplary dashed line 28 in FIG. 1, whereby DLL block 20 is provided with feedback for comparing the timing of the clock signal supplied on line 22 to command block 14 with the timing of incoming external clock signal CLK.

In the simplified example of FIG. 1, since command input buffer 14 and data input buffer 16 each receive and operate based on a clock signal, the command (CMD) input pin 15 and data (DATA) input pin 17 are said to be synchronous inputs. As such, binary data applied to input pins 15 and 17 will only be stored in the respective buffers 14 and 16 (a process sometimes referred to as "signal capture") upon a rising or falling edge of the corresponding internal clock signal.

As a result of the functionality of a typical DLL circuit such as DLL block 20 in FIG. 1, if the propagation and loading characteristics of line 22 varies significantly from that of, say, lines 24 and 26, DLL circuit can account for such differences in order to ensure that proper device operation can be maintained. Internally to DLL circuit 20, separate delays and skews (programmable, or automatically adjusted) may be introduced into the externally-applied clock signal to ensure that each of the other functional blocks in device 10 receives clock signals that are substantially synchronized with the others. The delays and skews introduced by a DLL may be miniscule, on the order of picoseconds, but may be nonetheless critical to the proper operation of a semiconductor device.

The functionality of DLLs can be thought of generally as a process of internal clock signal generation, and those of ordinary skill in the art will doubtless be familiar at least generally with the concept of DLLs in semiconductor devices. Various examples of DLL implementations for synchronous memory devices are proposed in U.S. Pat. No. 5,920,518 to Harrison et al., entitled "Synchronous Clock Generator Including Delay-Locked Loop;" U.S. Pat. No. 6,201,424B1 to Harrison, entitled "Synchronous Clock Generator including a Delay-Locked Loop Signal-Loss Detector;" and U.S. Pat. No. 6,130,856 to McLaury, entitled "Method and Apparatus for Multiple Latency Synchronous Dynamic Random Access Memory." The aforementioned '518, '424, and '856 patents are each commonly assigned to the Assignee of the present invention and each are hereby incorporated by reference herein in their respective entireties.

Those of ordinary skill in the art will appreciate that DLLs are frequently implemented in a manner specific to an intended operational speed of a clocked semiconductor device. For example, an SDRAM (and its DLLs) may be designed with a specification that it be operated with a clock speed of, say 100 MHz. In such a case, operation of a device at a speed substantially different (either slower or faster) than its specified speed may result in a situation in which the ability of its internal DLL block(s) to maintain synchronization between internally generated clock signals and the externally-applied clock signal(s) may be compromised.

The inability to maintain synchronization among internally generated clock signals and an externally-applied clock signal is typically not problematic in the course of normal operation of a semiconductor device. One reason why such inability may become a problem, however, relates to the testing of semiconductor devices. In some cases, it may be necessary or desirable to conduct tests on a partially or fully fabricated device at an operational speed (i.e., clock speed) that is substantially different than the ultimately intended operation of the device(s) being tested.

DRAMs, including SDRAMs, are often incorporated into so-called "memory modules" comprising a plurality of individual memory devices mounted upon a printed circuit board. After DRAMs (comprising one or more discrete integrated circuit components) are packaged and mounted on a printed circuit board, testing of the individual memory circuits becomes problematic because of the inaccessibility to internal circuit nodes, such as those related to the DLL circuitry. One reason that this is problematic is that often, the dedicated testing appliances and fixtures used to test semiconductor devices such as memory are incapable of operating at the speeds for which the devices under test are specified to operate. Thus, it may be desirable and/or necessary to operate the device(s) under test at slower clock speeds than they would be in the course of "normal" operation. As noted above, however, this can present problems in terms of the ability of certain internal circuitry, particularly DLLs, to function properly except within certain ranges of "normal" operating frequencies.

One solution to this potential problem has been to provide a "mode register" to which predetermined patterns of bits may be addressed to cause the device to begin operating in alternative modes, such as a test mode. In such an approach, decoder circuitry coupled to the mode register is conditioned to detect certain predetermined patterns of bits and to issue appropriate control signals and make appropriate internal adjustments to enable the device to operate a mode corresponding to the predetermined pattern of bits.

Operation in a test mode may involve temporarily disabling certain internal subcircuits, such as DLL circuitry, that might otherwise prohibit proper operation of the device at clock speeds substantially differing from the device's "normal" operating speed. Once the circuitry in question has been disabled, operation in a test mode (e.g., a mode involving a substantially slower operating speed) can commence without concern about such adverse effects.

One potential drawback to the above-described test mode-register approach is that the test mode circuits could impact speed-sensitive and critical circuit paths. That is, disablement of the circuitry known to be sensitive to substantial changes in operational speed could affect other timing relationships among internal signals. Another potential problem with the above-described approach is that providing a mode register may itself be undesirable, as it consumes valuable semiconductor "real estate" (i.e., substrate area) and increases circuit complexity. Even where an approach such as a mode register is employed, the number of different operational modes that can be specified is necessarily limited by the number of mode register bits, such that an insufficient number of modes may be available to accommodate all of the various test modes desired to be implemented.

Still another potential drawback to the "mode register" approach to the challenge of specifying an alternative mode of operation of a semiconductor device is that a control or data signal "capture" is required not only to place the device into the alternative mode, but also to restore the device to its "normal" mode. Consider, for example, an implementation in which a command or data input port used to place a device into an alternative mode of operation relies upon a "capture" subcircuit (such as command subcircuit 14 or data subcircuit 16 in the hypothetical example of FIG. 1) that itself depends upon a DLL-generated clock signal for proper operation. While it might be possible to place such a semiconductor device into the alternative mode of operation (assuming that it begins operating in a mode in which the DLL circuitry is activated), once the alternative mode of operation in which the DLL circuitry is deactivated is commenced, it might be difficult or impossible to thereafter "capture" the command (s) or data necessary to restore the device to its "normal" mode of operation. This is because the subcircuits used to capture the commands or data that might be used to restore "normal" operation cannot be "captured" by the corresponding subcircuits so long as the DLL circuitry is deactivated. This is a "Catch 22" or "chicken-and-egg" situation, in which the very mechanism for allowing "normal" operation of the device to resume is incapable of being reactivated until "normal" operation resumes.

Thus, it is believed that there remains a need for an improved method and apparatus by which a subcircuit within an integrated circuit device can be temporarily powered-down or disabled, and subsequently restored to normal operation.

SUMMARY OF THE INVENTION

The present invention relates to an apparatus and corresponding method by which a semiconductor device having one or more DLL-reliant subcircuits may be placed into alternative modes of operation in which the DLL circuitry is temporarily deactivated, and thereafter restored to "normal" operation (i.e. a mode in which the DLL circuitry is active).

In accordance with one embodiment, the invention relates to a method and apparatus in which one or more input signals that are normally accepted without involvement of internal DLL-reliant subcircuits (i.e., non-synchronous inputs) are additionally utilized to place a semiconductor device into an alternative mode of operation in which one or more internal DLL subcircuits are disabled.

In one embodiment, the present invention comprises a synchronous DRAM having one or more externally-applicable input signals which are received into internal circuitry by means not involving synchronization with an internally-generated DLL clock signal. In accordance with various conceivable embodiments of the invention, a combination of one or more externally-applied signals to a semiconductor device conditions the device to operate in a mode alternative to a "normal" operating mode. Such alternative mode preferably (but not exclusively) comprises a mode in which the device, being a synchronous device responsive in a normal mode to operate in a given manner, is conditioned in the alternative mode to operate in the same given manner except at a lower or higher rate of synchronous speed, i.e., at a lower or higher clock rate relative to its normal mode.

In one embodiment, the present invention comprises a synchronous DRAM having a plurality of input pins adapted to receive signals in synchronization with one or more internally-generated clock signals derived from at least one externally-applied external clock signal, the one or more internally-generated clock signals being generally referred to as DLL (delay lock loop) signals. Additionally, the disclosed DRAM has at least one, and preferably two, input pins adapted to receive signals asynchronously with respect to any internally- or externally-generated clock signal, or which are adapted to receive signals either synchronously or asynchronously with respect to any internally- or externally-generated signals.

In one disclosed embodiment, the semiconductor device enables both the deactivation and activation of internal processes relating to the generation of synchronous signals. In a particular embodiment, the invention encompasses the disabling and subsequent enabling of an internal delay lock loop subcircuit that is adapted in normal operation to coordinate the generation of one or more internal clocking signals with the application of one or more eternally-applied clock signals. In accordance with one aspect of the invention, the deactivation and activation of the internal DLL subcircuit is accomplished by means of application of signals to the one or more input pins adapted in normal operation to receive signals asynchronously with respect to any internally- or externally-generated clock signals.

In one specifically disclosed embodiment, the invention involves the use of external "reset" and "chip select" inputs to an SDRAM. In this particular embodiment, when an external "reset" signal is asserted upon an external input to the SDRAM with the externally-applied "chip select" input is applied at a first logic level to another external input, the SDRAM is conditioned to operate in a "normal" mode, but when the "reset" signal is asserted with the "chip select" input being applied at a second logic level, the SDRAM is conditioned to operate in an alternative mode of operation in which certain delay lock loop (DLL) subcircuitry within the SDRAM is disabled. With the DLL subcircuitry disabled, the SDRAM is capable of operating in an otherwise normal mode of operation, but with a clock signal having a substantially different frequency than specified for its normal operation being supplied to its one or more clock signal inputs.

BRIEF DESCRIPTION OF THE DRAWINGS

The foregoing and other features and aspects of the present invention will be best understood with reference to the following detailed description of a specific embodiment of the invention, when read in conjunction with the accompanying drawings, wherein:

FIG. 3a is a timing diagram illustrating electrical signals associated with initiation of the memory device of FIG. 2 into a first mode of operation;

FIG. 3b is a timing diagram illustrating electrical signals associated with initiation of the memory device of FIG. 2 into a second mode of operation.

DETAILED DESCRIPTION OF SPECIFIC EMBODIMENTS OF THE INVENTION

In the disclosure that follows, in the interest of clarity, not all features of actual implementations are described. It will of course be appreciated that in the development of any such actual implementation, as in any such project, numerous engineering and programming decisions must be made to achieve the developers' specific goals and subgoals (e.g., compliance with system and technical constraints), which will vary from one implementation to another. Moreover, attention will necessarily be paid to proper engineering practices for the environment in question. It will be appreciated that such a development effort might be complex and time-consuming, but would nevertheless be a routine undertaking for those of ordinary skill in the relevant fields.

Figure 1:
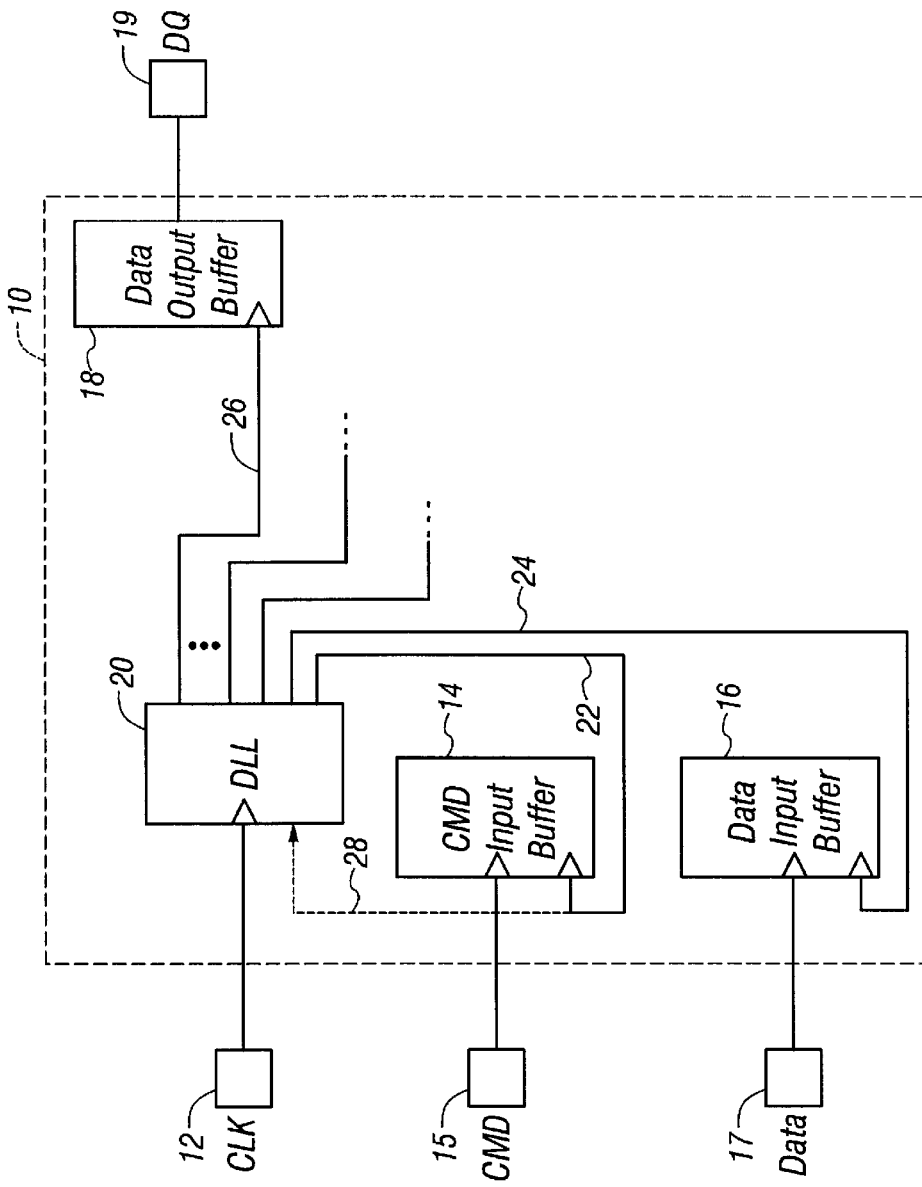
FIG. 1 is a schematic/block diagram of a prior art semiconductor device having one or more internally-generated delay lock loops therein.
Figure 2:
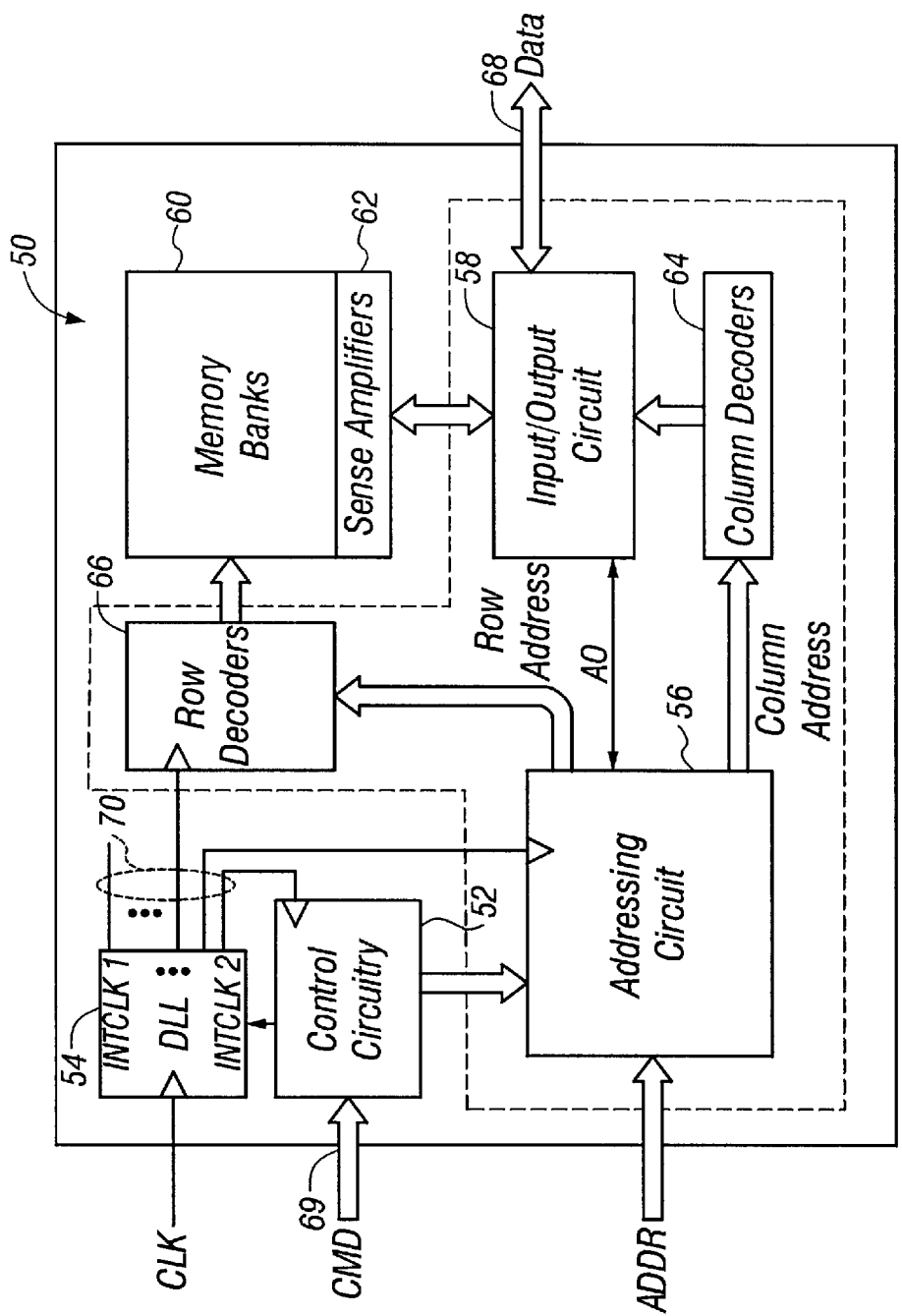
FIG. 2 is a schematic/block diagram of a semiconductor memory device in accordance with one embodiment of the invention.

Referring to FIG. 2, there is shown a highly simplified schematic/block diagram of a semiconductor memory device 50 in accordance with one embodiment of the invention. In the disclosed embodiment, memory device 50 is a synchronous dynamic random access memory (SDRAM), although those of ordinary skill in the art having the benefit of the present disclosure will appreciate that the invention is not limited in scope to application in SDRAM only. It will also be understood that SDRAM 50 incorporates a substantial amount of circuitry in addition to those functional components specifically represented in FIG. 2. However, such other circuitry has been omitted in the interests of brevity and clarity, since such circuitry is well-known to those of ordinary skill in the art and is not especially relevant to the practice of the present invention.

At the level of detail depicted in FIG. 2, it can be seen that SDRAM 50 includes a control circuit 52, a delay-locked loop circuit 54, an addressing circuit 56, in input/output circuit 58, memory banks 60, sense amplifier circuitry 62, column decoder circuitry 64, and row decoder circuitry 66. In one embodiment, memory device 50 comprises a plurality (e.g., four) of memory banks 60, sense amplifier circuits 62, column decoders 64 and row decoders 66, but for clarity of the present disclosure and drawings, only one of each of these functional components is depicted.

With continued reference to FIG. 2, SDRAM 50 has a plurality (e.g., eight) input/output (DATA) pins 68. Each of the memory banks 60 contains an array of memory cells arranged in rows and columns and are connected to a respective row decoder 66 and sense amplifier circuit 62. Each memory bank is also connected to input/output circuit 58, which is connected to the column decoder(s) 64. Input/output circuit 58 includes conventional read circuitry (not shown) for outputting data from the memory bank(s) 60 on the DATA pins 68. Input/output circuit also includes conventional write circuitry (also not shown) for inputting data received on DATA pins 68 into memory bank(s) 60.

Control circuit 52 is coupled to address circuit 56 and receives various external control signals as inputs. By way of example but not limitation, control circuit 52 may receive a chip select (CS#) signal and a RESET signal, although it is to be understood that a typical DRAM will receive numerous other control signals, such as row and column address strobe (RAS and CAS) signals, a write enable (WE#) signal, and so on. In FIG. 2, the various control signals are represented by command (CMD) bus 69. Those of ordinary skill in the art will be familiar with the various control signals applied to device 50 via command bus 69. Although not shown in FIG. 2, control circuitry 52 is likely to be coupled to most of the other functional components of device 60, in a conventional arrangement, such that control circuitry 52 is capable of interpreting the various control signals applied thereto and drive and control the overall operation of the remaining circuitry in device 50.

It is to be understood that although the various functional components of device 50 depicted in FIG. 2 are shown as separate, discrete circuits disposed in a well-defined spatial relationship with respect to one another, in actual implementation, the various circuits are likely to be dispersed throughout part or all of the semiconductor substrate, with portions of certain functional components being interspersed with one another. That is, FIG. 2 depicts device 50 from a functional perspective rather than an implementation-specific perspective.

Delay-locked loop (DLL) circuit 54 receives an external clock signal CLK at an input and generates a plurality of internal clock signals INTCLK1 . . . INTCLKN at a plurality of outputs 70 thereof. Each of the INTCLKx outputs from DLL circuit 54 is provided to one or more of the other functional components within device 50. For clarity, in the drawings, only a few exemplary connections between DLL circuit 54 and other functional circuits are depicted in FIG. 2, it being understood that internal clock signals would likely be provided to many other functional components of device 50.

As discussed above, the function of DLL circuit 54 is to generate internal clock signals that are each appropriately adjusted in time as to be synchronous with each other, enabling proper operation of the device.

Among the circuits shown in FIG. 2 as receiving an internal clock signal is addressing circuit 56. Because SDRAM 50 is a synchronous device, memory addresses must be applied to the ADDR pins in synchronization with the external CLK signal in order for the address information to be properly "captured" by addressing circuit 56. Likewise, data written to or read from device 50 must appear on input/output DATA pins 68 in a synchronous manner.

In accordance with one aspect of the invention, SDRAM 50 is preferably capable of operating an at least one test mode in which DLL circuit 54 is disabled. To provide for such functionality, in one embodiment control circuitry 52 is conditioned to be responsive to a predetermined pattern of externally-applied control signals on command bus 69 to disable DLL circuitry 54 and commence operation of device 50 in a test mode (i.e., a "DLL off" mode). In DLL off mode, the externally-applied CLK signal is applied directly to the various functional components of device 50 which normally would receive the INTCLK clock signals generated by DLL circuit 54, i.e., DLL circuit 54 would perform no adjustment to the eternally-applied CLK signal. In this way, with device 50 operating in DLL off mode, it can be operated at any clock speed, including a speed substantially slower than the device's normal operating speed. For example, a memory specified in normal operation to use a 100 MHz clock could be operated for testing purposes at 10 MHz in a DLL off mode.

In accordance with another aspect of the invention, the control signals involved in placing device 50 into and out of a DLL off mode are asynchronous, or un-clocked, signals, such as a chip select (CS#) and RESET# signal applied to device 50 via command bus 69. The significance of this lies in the ability to restore device 50 to a "normal" operating mode after being in a DLL off mode. If synchronous (i.e., clocked) inputs were to be used for the purpose of changing operating modes of device 50, it could be difficult if not impossible to restore device 50 to a normal operating mode once it has been placed into an operating mode in which DLL circuit 54 is disabled.

Referring to FIG. 3a, there is shown a timing diagram showing the state of certain signals associated with operation of device 50 in a normal mode of operation. In accordance with conventional implementation of SDRAMs, device 50 must be reset upon its being powered up. To this end, command bus 69 includes a RESET# input pin for receiving a RESET# input signal. Likewise, in accordance with conventional SDRAM implementation, device 50 receives a chip select (CS#) input signal on a pin in command bus 69. The chip select (CS#) input signal enables and disables certain decoding circuitry within control circuit 52, such that various input signals (commands) applied to command bus 69 are masked when the chip select signal indicates that the chip is not selected for operation. In a conventional manner, the chip select input provides for external bank selection in systems incorporating multiple memory devices 50 each functioning as a separate one of multiple banks of memory.

In accordance with one aspect of the invention, both the chip select (CS#) and reset (RESET#) inputs are asynchronous inputs, meaning that the state of the CS# and RESET# signals applied to these inputs are sampled without regard to the clock (CLK) signal.

In accordance with conventional implementation, device 50 must be powered up and initialized in a predefined manner. After power is applied to various power-supply inputs (not shown) in a specified sequence (to avoid device latch-up). After all power supply and reference voltages are stable, a clock signal CLK is applied to the clock input. A stable clock signal CLK must be present for a predetermined period of time (for example, 200 μSec).

Next, a reset command must be issued. In the disclosed embodiment, a reset command is a logical high pulse applied to the RESET input while the chip select signal CS remains at a logical low level. (Again, the RESET and CS inputs are part of command bus 69 in FIG. 2). In one embodiment, the RESET pulse must have some minimum duration. The reset command initiates and synchronizes (locks) the DLL clock signals and precharges memory banks 60.

Referring to FIG. 3a, the clock signal CLK is generated starting at time $t_1$, and remains stable for 200 μSec, until time $t_2$. In one embodiment, clock signal CLK may have a frequency on the order of 200 to 300 mHz. At time $t_2$, the RESET signal is asserted (logical high) and remains asserted for at least a minimum period of time, designated $t_{RSTPW}$ in FIG. 3, until time $t_3$. At time $t_3$, the RESET signal is deasserted (logical low). Following another minimum time interval, designated $t_{RESET}$ in FIG. 3a, operation of device 50 continues with a refresh command, which involves assertion of the chip select (CS) signal, at time $t_4$. It is to be noted that during the reset command depicted in FIG. 3a, the chip select (CS) signal is maintained at a logical low (deasserted) level. That is, during operation of device 50 in its normal mode of operation, the CS signal is not asserted concurrently with the RESET signal, and vice versa.

Turning now to FIG. 3b, there is shown a timing diagram corresponding to initialization of device 50 into a mode in which DLL circuit 54 is disabled (the "DLL off mode"). As shown in FIG. 3b, initialization into the DLL off mode begins with the assertion of the chip select signal CS at time $t_5$. In accordance with one aspect of the invention, the clock signal WCK is in a "don't care" state during the initialization sequence of FIG. 3b.

The chip select signal must be asserted for a minimum period of time designated $t_{SCS\_DLL}$ in FIG. 3b. Then, at time $t_6$, a reset pulse begins with the assertion (logical high) of the RESET signal. The reset pulse lasts for reset pulse interval $t_{RSTPW}$, until time $t_7$, when RESET is deasserted. The chip select (CS) signal, however, remains asserted as RESET is deasserted, and, in the presently disclosed embodiment, must stay asserted for a minimum interval of tHCS_DLL following deassertion of RESET, or until time $t_8$.

Following time $t_8$, both RESET and CS remain deasserted until an interval $t_{DLLOFF}$ following deassertion of RESET at time $T_7$ has elapsed, or until time $t_9$. Thereafter, operation of device 50 in DLL off mode can commence, starting with application of a clock signal to the CLK input. In accordance with one feature of the invention, with DLL circuitry 54 disabled, the CLK signal in FIG. 3b can be substantially different than that specified for device 50 in normal operation. Notably, the CLK signal in FIG. 3b following initialization of device 50 into DLL off mode can be an order of magnitude or more slower than CLK signal in normal operation. Thus, whereas clock signal CLK may be 200 to 300 mHz in FIG. 3a, clock signal CLK in FIG. 3b may be, for example, 10 to 50 mHz. Those of ordinary skill in the art will appreciate the advantages of this for the purposes of testing device 50. In particular, once device 50 has been initialized into the DLL off mode, the devices operation can be tested using conventional techniques and testing equipment while operating at a synchronous clock frequency that is substantially less than the minimum normal operating frequency specified for the device. As noted above, a given semiconductor device may be specified by the manufacturer to operate with a synchronous external clock frequency of no less than, for example, 100 mHz (sometimes referred to as a "part rating"), whereas in DLL off mode, the device may be operated in testing mode at a substantially lower frequency, for example, less than 50 mHz.

Moreover, those of ordinary skill in the art will appreciate the desirability of not utilizing a mode register for the purposes of switching between the normal mode of operation and the DLL off mode of operation. Specifically, the present invention does not require any of the limited number of mode register bit patterns to be dedicated to the DLL off functionality. Indeed, the present invention does not require the existence of a mode register at all.

In a preferred embodiment of the invention, once testing in the DLL off mode has been completed, memory device 50 may be restored to a "normal" operating mode by issuing a conventional RESET command as described above.

Figure 4:
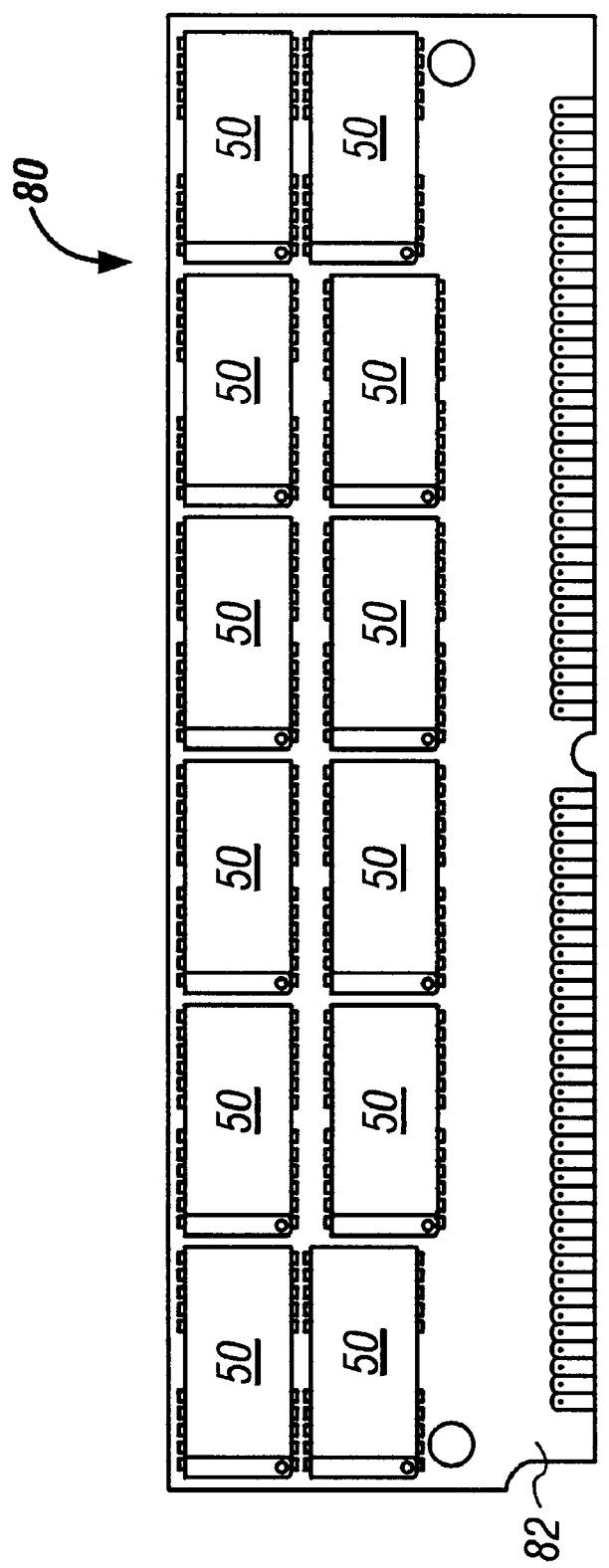
FIG. 4 is a diagram illustrating a memory module incorporating a plurality of the memory devices of FIG. 2 therein.

As noted above, the present invention is believed to be especially advantageous for facilitating the testing of memory devices like memory device 50 after multiple memory devices have been mounted on a circuit board, such as those of the well-known single-in-line memory module (SIMM) or dual-in-line memory module (DIMM) varieties. This is because most testing appliances for such modules are not adapted for operation devices under test at their specified "normal" operating clock speeds. This can be problematic if the individual memory devices incorporated into a module use DLL circuitry not able to adapt to the slower operating speeds of the testing appliance. Turning now To FIG. 4, there is shown an illustration of a SIMM 80 incorporating multiple (12) memory devices 50. Module 80 comprises a circuit board 82 having a plurality of individual memory devices 50 substantially the same as described herein with reference to FIGS. 2, 3a, and 3b disposed thereon. In this embodiment, module 80 is of the JEDEC and industry standard 72-pin type, which may have, for example, 16 MB or 32 MB capacities.

From the foregoing detailed description of specific embodiments of the invention, it should be apparent that a memory device capable of operating in at least two modes, wherein in one mode certain subcircuit(s) of the memory device is/are disabled has been disclosed. Methods of operating such a memory device have also been disclosed. Advantageously, the present invention does not utilize a mode register for the purposes of enabling the device to be switched between a normal mode of operation and a DLL off mode of operation. Although specific embodiments of the invention have been disclosed herein in some detail, this has been done solely for the purposes of describing various features and aspects of the invention, and is not intended to be limiting with respect to the scope of the invention. It is contemplated that various substitutions, alterations, and/or modifications may be made to the disclosed embodiment, including but not limited to those implementation variations which may have been suggested herein, may be made to the disclosed embodiments without departing from the spirit and scope of the invention as defined by the appended claims, which follow.

What is claimed is:

1. A synchronous semiconductor device operable in a normal mode of operation and an alternative mode of operation, comprising:

a first input terminal for receiving a first asynchronous input signal;

a second input terminal for receiving a second asynchronous input signal, said second asynchronous input signal and said first asynchronous signal not asserted concurrently during operation of said device in said normal mode;

at least one input buffer for receiving a synchronous input signal;

at least one clock terminal for receiving an external clock signal;

a delay lock loop circuit, coupled to said clock terminal and responsive to said external clock signal to generate at least one internal clock signal to be applied to said at least one input buffer, said delay lock loop circuit adapted to be activated during said normal mode of operation and to be deactivated during said alternative mode of operation;

control circuitry, coupled to said first and second input terminals and to said delay lock loop circuit, said control circuitry being responsive to concurrent assertion of said first and second asynchronous input signals to deactivate said delay lock loop circuit, thereby placing said device into said alternative mode of operation.

2. A semiconductor device in accordance with claim 1, wherein said device is a semiconductor memory device.

3. A semiconductor device in accordance with claim 2, wherein said device is a synchronous dynamic random access memory.

4. A semiconductor device in accordance with claim 2, wherein said first asynchronous input signal is a RESET signal.

5. A semiconductor device in accordance with claim 4, wherein said second asynchronous input signal is a chip select signal.

6. A semiconductor device in accordance with claim 1, wherein said alternative mode of operation is a test mode.

7. A semiconductor device in accordance with claim 1, wherein the frequency of said clock signal is lower for said alternative mode of operation than for said normal mode of operation.

8. A semiconductor device in accordance with claim 7, wherein the frequency of said clock signal for said normal mode of operation is greater than about 100 mHz.

9. A semiconductor device in accordance with claim 8, wherein the frequency of said clock signal for said alternative mode of operation is less than about 50 mHz.

10. A synchronous semiconductor device selectively operable in a normal mode of operation and an alternative mode of operation, comprising:

a first input terminal for receiving a first asynchronous input signal;

a second input terminal for receiving a second asynchronous input signal;

a command bus for receiving a plurality of synchronous control signals;

a clock terminal for receiving an external clock signal;

an clocking circuit, coupled to said clock terminal, said clocking circuit being responsive to said clock signal to generate at least one internal clock signal;

wherein said device is responsive to assertion of said first asynchronous signal while said second asynchronous signal is deasserted to perform a first function in said normal mode of operation and is responsive to assertion of said second asynchronous signal while said first asynchronous signal is deasserted to perform a second function in said normal mode of operation;

and wherein said device is responsive to concurrent assertion of said first and second asynchronous signals to enter into said alternative mode of operation.

11. A device in accordance with claim 10, wherein said clocking circuit is disabled in said alternative mode of operation.

12. A device in accordance with claim 11, wherein said device is a semiconductor memory.

13. A device in accordance with claim 12, wherein said device is a dynamic random access memory.

14. A device in accordance with claim 11, wherein the frequency of said external clock signal is lower for said alternative mode of operation relative to said normal mode of operation.

15. A device in accordance with claim 10, wherein said first asynchronous signal is a RESET signal and said first function in said normal mode is a reset function.

16. A device in accordance with claim 15, wherein said second asynchronous signal is a chip select signal and said section function in said normal mode comprises enabling of a command decoder coupled to said command bus.

17. A device in accordance with claim 14, wherein the frequency of said external clock in said normal mode of operation is greater than about 100 mHz.

18. A device in accordance with claim 17, wherein the frequency of said external clock in said alternative mode of operation is less than about 50 mHz.

19. A device in accordance with claim 10, wherein said clocking circuit comprises a delay lock loop circuit.

20. A method of operating a synchronous semiconductor device operable in a normal mode of operation and an alternative mode of operation, comprising:

(a) responding to assertion of a first asynchronous input signal and deassertion of a second asynchronous signal to perform a first function in said normal mode of operation;

(b) responding to assertion of said second asynchronous signal and deassertion of said first asynchronous signal to perform a second function in said normal mode of operation; and (c) responding to concurrent assertion of said first and second asynchronous signals to enter into said alternative mode of operation.

21. A method in accordance with claim 20, wherein said device is responsive to entering into said alternative mode of operation to disable an internal clocking circuit.

22. A method in accordance with claim 20, wherein said first asynchronous input signal is a RESET signal, and said first function in said normal mode of operation is a reset function.

23. A method in accordance with claim 22, wherein said second asynchronous input signal is a chip select signal, and said second function in said normal mode of operation is the enabling of a synchronous command input buffer.

24. A method in accordance with claim 20, wherein said device is a synchronous memory device.

25. A method in accordance with claim 24, wherein said device is a synchronous dynamic random access memory device.

26. A method in accordance with claim 20, further comprising:

(d) operating at a slower synchronous clock speed in said alternative mode of operation relative to said normal mode of operation.

27. A method of testing a synchronous semiconductor device having both synchronously and asynchronously captured input terminals and a clock input terminal, and specified to operate in a normal mode at no less than a minimum synchronous clock frequency, comprising:

(a) applying a predetermined sequence of asynchronous input signals to said asynchronous input terminals to initialize said device into a testing mode;

(b) in response to initialization into said testing mode, disabling an internal clocking circuit in said device;

(c) applying a clock signal having a frequency less than said minimum synchronous clock frequency to said clock input terminal; and (d) testing operation of the device operating in said testing mode.

28. A method in accordance with claim 27, wherein said device is a semiconductor memory device.

29. A method in accordance with claim 28, wherein said device is a dynamic random access memory device.

30. A method in accordance with claim 27, wherein said predetermined sequence of asynchronous input signals comprises concurrent assertion of two asynchronous input signals not concurrently asserted during normal operation of the device.

31. A method in accordance with claim 30, wherein said two asynchronous input signals comprise a RESET signal and a chip select signal.

32. A method in accordance with claim 27, wherein said minimum synchronous clock frequency is about 100 mHz.

33. A method in accordance with claim 32, wherein said frequency less than said minimum synchronous clock frequency is less than about 50 mHz.

34. A synchronous dynamic random access memory device operable in a normal mode of operation and a testing mode of operation, comprising:

a plurality of synchronously captured input signal terminals;

at least two asynchronously captured input signal terminals;

a synchronous clock terminal for receiving an external clock signal;

an internal clocking circuit coupled to the synchronous clock terminal and responsive to said external clock signal to generate at least one internal clock signal;

control circuitry coupled to said plurality of synchronously captured input signal terminals and to said at least two asynchronously captured input signal terminals;

wherein said memory device is specified to operate in normal mode using an external clock signal having a frequency above a predetermined minimum normal operating frequency;

and wherein said control circuitry is responsive to a predetermined sequence of asynchronous input signals applied to said at least two asynchronously captured input signal terminals to disable said internal clocking circuit and thereafter operate said memory device in said testing mode of operation;

and wherein said external clock signal during operation in said testing mode of operation has a frequency less than said predetermined minimum normal operating frequency.

35. A memory device in accordance with claim 34, wherein said predetermined sequence of asynchronous input signals comprises concurrent assertion of two asynchronous input signals.

36. A memory device in accordance with claim 35, wherein said two asynchronous input signals comprise a RESET signal and a chip select signal.

37. A memory device in accordance with claim 34, wherein said internal clocking circuit comprises a delay locked loop circuit.

38. A memory device in accordance with claim 34, wherein said predetermined minimum normal operating frequency is about 100 mHz.

39. A memory device in accordance with claim 38, wherein said frequency less than said predetermined minimum normal operating frequency is about 50 mHz.

40. A memory module, comprising a plurality of discrete semiconductor memory devices mounted on a printed circuit board, wherein each of said plurality of discrete semiconductor memory devices is operable in a normal mode of operation and an alternative mode of operation, each discrete semiconductor memory device comprising:

a first input terminal for receiving a first asynchronous input signal;

a second input terminal for receiving a second asynchronous input signal;

a command bus for receiving a plurality of synchronous control signals;

a clock terminal for receiving an external clock signal;

an clocking circuit, coupled to said clock terminal, said clocking circuit being responsive to said clock signal to generate at least one internal clock signal;

wherein said device is responsive to assertion of said first asynchronous signal while said second asynchronous signal is deasserted to perform a first function in said normal mode of operation and is responsive to assertion of said second asynchronous signal while said first asynchronous signal is deasserted to perform a second function in said normal mode of operation;

and wherein said device is responsive to concurrent assertion of said first and second asynchronous signals to enter into said alternative mode of operation.

41. A device in accordance with claim 40, wherein said clocking circuit is disabled in said alternative mode of operation.

42. A device in accordance with claim 41, wherein said device is a semiconductor memory.

43. A device in accordance with claim 42, wherein said device is a dynamic random access memory.

44. A device in accordance with claim 41, wherein the frequency of said external clock signal is lower for said alternative mode of operation relative to said normal mode of operation.

45. A device in accordance with claim 40, wherein said first asynchronous signal is a RESET signal and said first function in said normal mode is a reset function.

46. A device in accordance with claim 45, wherein said second asynchronous signal is a chip select signal and said section function in said normal mode comprises enabling of a command decoder coupled to said command bus.

47. A device in accordance with claim 44, wherein the frequency of said external clock in said normal mode of operation is greater than about 100 mHz.

48. A device in accordance with claim 47, wherein the frequency of said external clock in said alternative mode of operation is less than about 50 mHz.

49. A device in accordance with claim 40, wherein said clocking circuit comprises a delay lock loop circuit.

\* \* \* \* \*